United States Patent [19]

Ohta et al.

[11] Patent Number: 4,812,634
[45] Date of Patent: Mar. 14, 1989

[54] IC CARD WITH A SOLAR BATTERY

[75] Inventors: Satoshi Ohta; Kouzi Tanagawa, both of Tokyo; Hideo Yamamoto; Keiji Kumagai, both of Saitama, all of Japan

[73] Assignees: Oki Electric Industry Co., Ltd.; Toa Nenryo Kogyo Kabushiki Kaisha, both of Tokyo, Japan

[21] Appl. No.: 218,082

[22] Filed: Jul. 12, 1988

[30] Foreign Application Priority Data

Jul. 13, 1987 [JP] Japan ................. 62-174544

[51] Int. Cl.⁴ ........................... G06K 19/06
[52] U.S. Cl. ..................... 235/492; 235/487
[58] Field of Search ................. 235/487, 492

[56] References Cited

U.S. PATENT DOCUMENTS 4,758,781 7/1988 Futisaki .............................. 235/492

Primary Examiner—Harold I. Pitts
Attorney, Agent, or Firm—Martin M. Novack

[57] ABSTRACT

An IC card having a plastics card body which mounts a CPU, a RAM, a ROM, a solar battery mounts also to EEPROM (electrically erasable programmable read only memory), which is used for identification of a card owner. Due to high power consumption of said EEPROM, a tandem type solar battery in which a plurality of opto-electric conversion cells are laminated on a substrate is used. The present IC card can operate with only the solar battery mounted inside of the IC card, and has no secondary battery.

7 Claims, 9 Drawing Sheets

Fig. 8
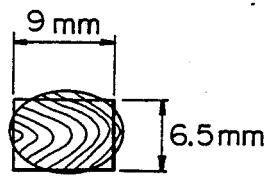
Fig. 9(a)  Fig. 9(b)
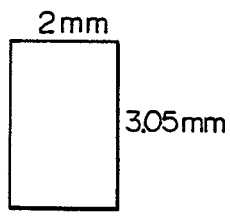 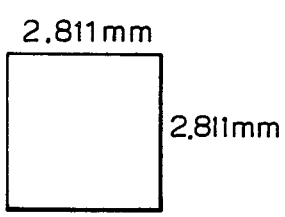
Fig. 10  PRIOR ART
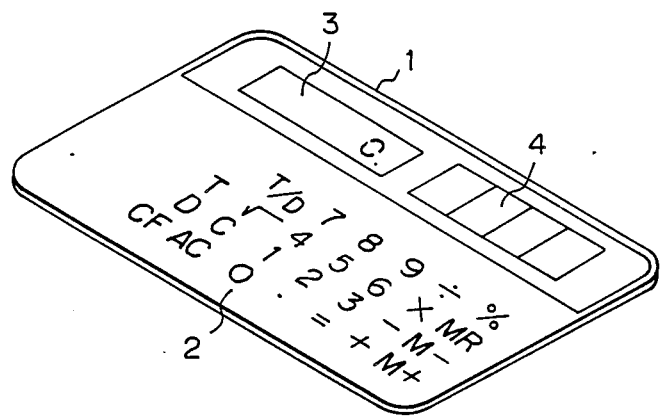

IC CARD WITH A SOLAR BATTERY

BACKGROUND OF THE INVENTION

The present invention relates to an IC card with a solar battery, and, in particular, relates to such a card having a key input, a display, an integrated circuit (IC) for memory and calculation, and, a solar battery as power supply for the above circuits. The present invention is to be used, for instance as a bankbook. The present invention has the feature of containing a solar battery as part of an IC card, but has no secondary battery.

A prior IC card is shown in Japanese patent laid open publication No. 5389/86.

FIG. 10 is a perspective view of the prior IC card in said publication, and FIG. 11 is a circuit diagram of the IC card of FIG. 10. In those figures, on one surface of the card 1, a key input portion 2 having a keyboard for data input, a display device 3 for data display with liquid crystal display element, and a solar battery 4 for power supply, are mounted. And on the other surface of the card contains a terminal 5 for external connection for both data and power supply and an embossment for identification code. A secondary battery 6 coupled with the solar battery 4, and the IC (integrated circuit) 10 are also mounted on the card 1. The IC 10 has a central processing unit (CPU) 11 for calculation, a read only memory (ROM) 12 for storing a program and data, a random access memory (RAM) 13 for storing data, an electrically erasable programmable read only memory (EEPROM) 14 which is a read only memory but is electrically rewritable, a display circuit 15, and a timer-calendar circuit 16. The EEPROM 14 is a read only memory, but is rewritable by applying a predetermined voltage, and maintains contents with no power supply. The EEPROM 14 includes a voltage booster for raising the voltage to operational voltage of the EEPROM (for instance, 21 volts), to rewrite data, a first storage area for storing a secret number and/or an identification number, and a second storage area for storing the count number of incoincidence between said secret number and the number which is input by the card owner.

In operation, when the IC card is used for payment, the display is first cleared by operation of the key input 2, then, the secret code is input to the CPU 11 through the operation of the key input 2. Then, the CPU 11 compares the secret code stored in the EEPROM 14 with the input data from the key input 2, and if they are coincident with each other, the code "OK" is displayed on the display unit 3 through the display circuit 15. Thus, it is confirmed that the user is the true card owner, and so, the store clerk processes the IC card with an emboss-in-printer, similar to a conventional credit card.

On the other hand, if the code from the key input 2 differs from the content of the EEPROM 14, the CPU 11 displays the fact of the incoincidence on the display unit 3, and urges the re-try. The CPU 11 counts the number of the incoincidence by using the second storage area in the EEPROM 14 by storing the count number of the incoincidence in that area. When the content of that second area reaches "5", the CPU 11 recognizes that the user is not the true card owner, makes the card invalid, and displays that the card is invalid on the display unit 3. Therefore, the illegal use of an IC card is prevented.

The power supply to the IC 10 is effected by the secondary battery 6 which is charged by the solar battery 4. Therefore, even when the solar battery does not operate in dark circumstance, the IC 10 has power supplied, and so, the IC 10 can operate even in insufficient light.

As for a solar battery, the ELA015 (trade name) described in "Fuji amorphous silicon solar battery" manufactured by Fuji denki Co. Ltd, is commercially obtainable in the market. The external size of that solar battery is $35.1 \times 13.7 \times 0.1$ (mm), and the electrical characteristics are that the output voltage is 1.5 V and the operational current is 6 $\mu$A in 200 Lux. That solar battery has a single plane layer of four amorphous silicon elements connected in series to one another.

However, a prior IC card with a prior solar battery has disadvantages as follows.

In said Japanese patent laid open publication 5839/86, no description is given for the power consumption in the IC 10, the output power of the solar battery 4, and the capacity of the secondary battery 6. In our analysis, a prior solar battery having a single layer structure cannot operate an IC card, which updates the contents of the EEPROM 14 according to the number of errors of the input of the identification number, if it is assumed that no external power supply is used, and that the size of an IC card is a standard one ($86 \times 54$ mm$^2$). An EEPROM 14 requires the power consumption of 1.35 V, 20 $\mu$A only for writing several bits of data, and the necessary power consumption of the EEPROM 14 increases as the number of bits increases. In other words, a prior single layer solar battery can not operate an IC card which updates an EEPROM.

The size of an IC card is standardized internationally to $86 \times 54$ mm$^2$, which has the area of 4644 mm$^2$. And, the area for the solar battery is for instance 924 mm$^2$ (20% of the whole area of an IC card), which is the rest of the area of the IC card which mounts other members.

When the area for a solar battery is fixed to 924 mm$^2$, the characteristics of a prior single layer solar battery is analyzed below.

A prior single layer solar battery 50 in FIG. 12 has a substrate 51 made of stainless steel of the width 0.05-2 mm, an insulation layer 52 made of polyimide resin deposited on the substrate 51, and the conversion cells 53-1 through 53-3 deposited on the insulation layer 52. Those cells are deposited on one plane and are connected in series to one another. Each of the cells 53-1 through 53-3 is produced through plasma CVD process, having a conductive metal electrode 53a, a single layer of opto-electric conversion layer 53b made of P-I-N (or N-I-P) type amorphous silicon, and a transparent electrode 53c. A dead space 54 is provided to separate each cells 53-1 through 53-3. The three cells are connected in series by connecting the electrode 53c of the first cell 53-1 to the electrode 53a of the second cell 53-2, and connecting the electrode 53c of the second cell 53-2 to the electrode 53a of the third cell 53-3.

FIG. 13 shows the curves between voltage and current of the solar battery 50 in FIG. 12, in which the horizontal axis shows the output voltage V (volts), the vertical axis shows the output current ($\mu$A), and the light intensity is 200 Lux (fluorescent lamp). In FIG. 13, the curve 60 shows the characteristics when four cells are connected in series, the curve 61 shows the case of three cells connected in series, and the curve 62 shows the case of two cells connected in series. The shadowed area A shows the area that the write operation to the EEPROM 14 in the IC 10 is possible. The write operation to EEPROM 14 needs the voltage about 1.35 V, and the current higher than 20 μA.

It should be noted in FIG. 13 that none of the curves 60, 61 and 62 crosses with the area A. It means that a prior single layer solar battery of FIG. 12 can not operate the EEPROM 14 in the IC 10. Although the IC 10 might operate with a prior single layer solar battery if the light intensity would be very high, it is not practical.

If we try to update an EEPROM in a prior IC card, we must use a large solar battery so that higher power is obtained, or a large secondary battery must be used. However, since the size and the depth of an IC card are given, if the size of a solar battery mounted in the IC card is large, the area for other components must be decreased. Thus, the area for a key input 2 and/or display unit 3 would be decreased, and so, the operation of a key input 2 would become inconvenient, and/or the number of characters on the display unit would be decreased, or at least the size of the characters on the display unit would be decreased. Similarly, if we try to use a large secondary battery, the area for other components must be decreased, and/or the size of an IC card itself must be increased.

SUMMARY OF THE INVENTION

It is an object, therefore, of the present invention to overcome the disadvantages and limitations of a prior IC card, by providing a new and improved IC card.

It is also an object of the present invention to provide an IC card having a solar battery, in which an update of an EEPROM is possible by using an inside solar battery, without using an external power supply, nor a secondary battery.

The above and other objects are attained by an IC card with a solar battery comprising; a card body, a key input portion for data input mounted on a first surface of said card body, a display unit for data display mounted on said first surface of said card body, a solar battery for supplying operational power for said IC card mounted on said first surface of the card body, and an integrated circuit having at least a CPU, a ROM for storing program for operating said CPU, a RAM for storing operational data of said CPU, and an EEPROM for storing electrically erasable read only data, wherein said solar battery is a tandem type solar battery having a substrate (30), a plurality of laminated opto-electric conversion cells (31-1, 31-2, 31-3) made of amorphous silicon alloy deposited on said substrate (30), and a transparent electrode (32) mounted on said conversion cells.

BRIEF DESCRIPTION OF THE DRAWINGS

The foregoing and other objects, features, and attendant advantages of the present invention will be understood as the same become better understood by means of the following description and accompanying drawings wherein;

FIG. 8 shows a finger print, FIG. 9. shows size of a character, FIG. 10 is a perspective view of a prior IC card.

DESCRIPTION OF THE PREFERRED EMBODIMENTS

Figure 1:
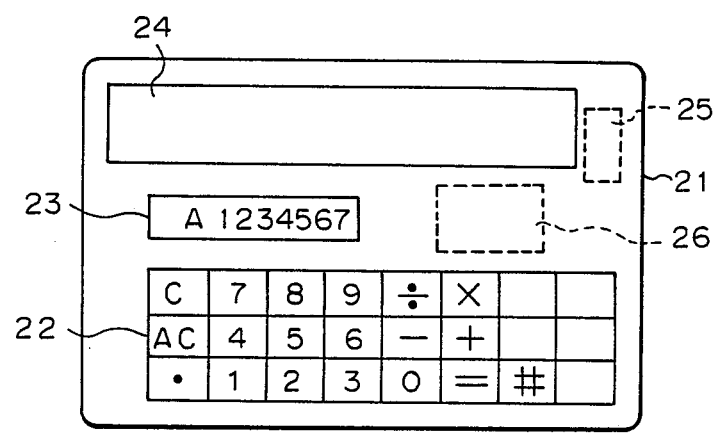
FIG. 1 is a plan view of an IC card according to the present invention.
Figure 2:
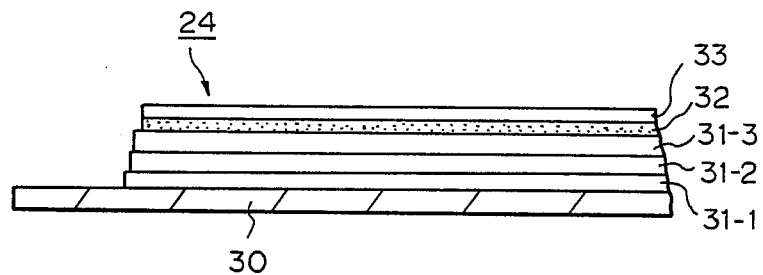
FIG. 2 is a cross section of a solar battery portion in FIG. 1.

FIG. 1 is a plan view of the IC card having a solar battery according to the present invention, and FIG. 2 is an enlarged cross section of a solar battery portion 24 of FIG. 1.

The IC card according to the present invention has, as shown in FIG. 1, a card body 21 made of plastics. On one surface of the card body 21, there are provided a key input portion 22 having key boards for data input, a display unit 23 having LCD (liquid crystal display) for data display, and a solar battery 24 for power supply. On the other surface of the card 21, there are provided an external connection terminal 25 of contact type or non contact type for input and output of data and for power supply from an external device, and embossed or printed characters for showing identification codes et al. An IC (integrated circuit) 26 for operating the IC card is embedded in the card 21

FIG. 2 shows a solar battery 24, which has a substrate 30 which operates as one of the electrodes made of stainless steel, a plurality of laminated opto-electric energy conversion cells 31-1 through 31-3 mounted on said substrate 30, a transparent electrode 32 made of ITO (indium tin oxide) mounted on said conversion cells, and a protection resist 33 on said transparent electrode 32.

Each of the opto-electric conversion cells 31-1 through 31-3 is made of P-I-N (or N-I-P) type amorphous silicon cell produced through plasma CVD method. The laminated cells 31-1 through 31-3 are essentially connected serially to one another, so that the output electric power is obtained between the substrate 30 and the, transparent electrode 32. The wavelength characteristics of each of the cells depend upon each cell, and the upper cell converts the shorter wavelength light, so that the light illuminating the cells is efficiently converted to electricity. The thickness of each portion of the solar battery 24 is, for instance, such that the thickness of the substrate 30 is in the range between 50 μm and 200 μm, the thickness of the conversion cells 31-1 through 31-3 is in the range between 0.3 μm and 0.6 μm (each cell is in the range between 0.05 μm and 0.4 μm), the thickness of the transparent electrode 32 is 500–800 Å, and the thickness of the protection resist is in the range beween 10 μm and 50 μm.

Figure 3:
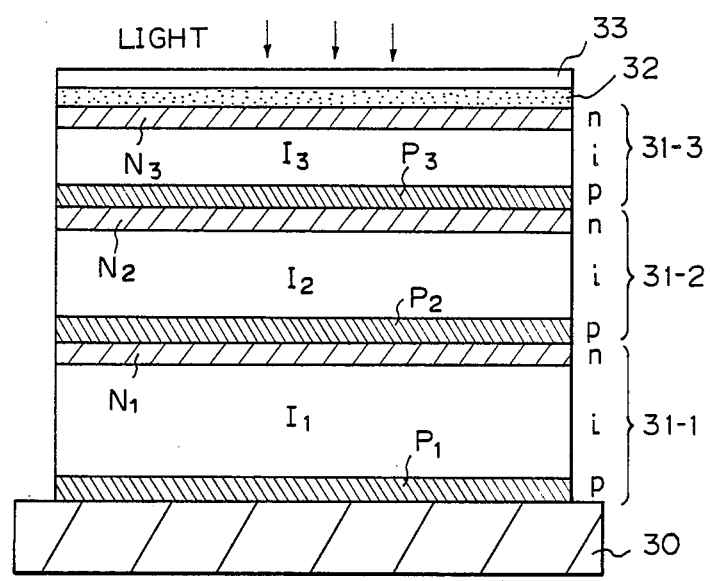
FIG. 3 is a cross sectional view of a solar battery in FIG. 1.
Figure 5:
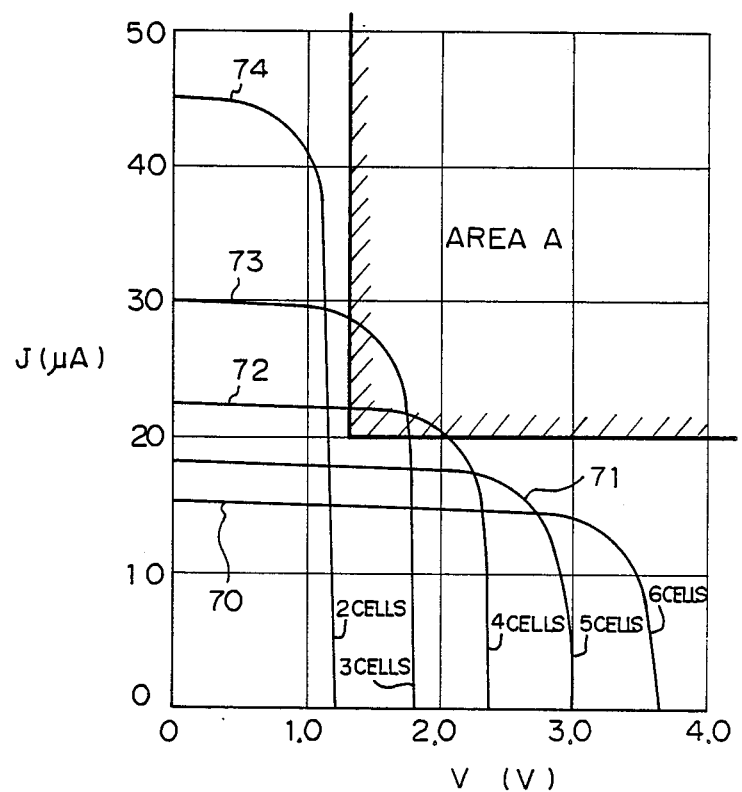
FIG. 5 shows the characteristics curves of the solar battery of FIGS. 2 and 3 according to the present invention.
Figure 13:
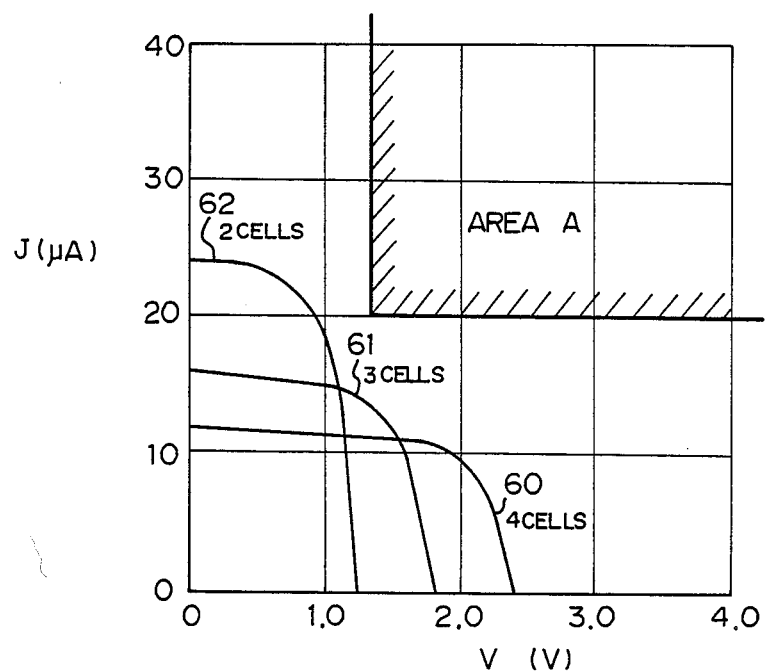
FIG. 13 shows characteristics curves of the prior solar battery of FIG. 12.

The voltage-current characteristics curves of the tandem type solar battery of FIGS. 2 and 3 are shown in FIG. 5, in which the area of the solar battery is 924 mm$^2$, the curve 70 shows the case., where there are six opto-electric conversion cells (31-1 through 31-3), the curve 71 shows the case of five conversion cells, the curve 72 shows the case of four conversion cells, the curve 73 shows the case of three conversion cells, and the curve 74 is the case of two conversion cells. The light intensity and other conditions in FIG. 5 are the same as those of FIG. 13. It should be appreciated in FIG. 5 that both the curves 72 and 73 crosses with the operation area A, and therefore, it is clear that the tandem type solar battery having three or four laminated tandem opto-electric conversion cells can operate the EEPROM in the IC card, in spite of the limited area (924 mm$^2$) and limited ratio (20%) to the whole area of an IC card. Therefore, we concluded that the tandem type solar battery having three or four conversion cells is the best for an IC card which operates with a power supply voltage of 1.35–1.5 volt. It should be appreciated that the four cells type tandem solar battery 72 can be replaced by two series connected two cells tandem type solar battery, each having half the area of that of the curve 72.

The occupation ratio of a solar battery 24 is not restricted severely to 20%, but the ratio between 10% and 30% is possible. Since the light intensity higher than 400 Lux is possible in an office or a dwelling, the half area of a solar battery (10% or 462 mm$^2$) is enough for operating an IC card. The upper limit of the ratio of a solar battery is 30%, since if that ratio is higher than 30%, the area of an key input portion, and a display unit would be decreased, and the operability of an IC card would be decreased.

Figure 12:
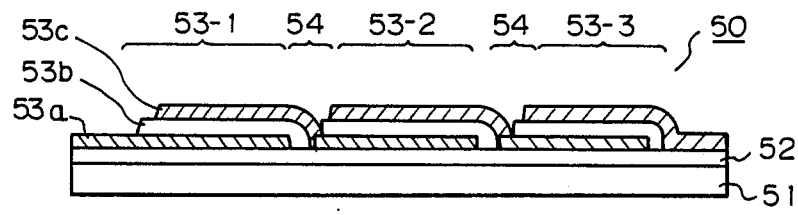
FIG. 12 is a cross section of a prior solar battery.

Next, the present solar battery 24 of tandem type is compared with a prior single layer solar battery 50 of FIG. 12.

Provided that the energy conversion efficiency of each conversion cell 53-1 through 53-3 is constant, and the area of the solar battery is given, the output power of the prior solar battery of FIG. 12 is lower than that of FIG. 5, because of the presence of the dead space 54 which does not operate to convert optical energy to electrical energy. Since the tandem type solar battery of FIG. 2 has no dead space, the whole area of the solar battery is used for opto-electric conversion.

Further, the present solar battery has the higher fill factor, which is defined by;

$$\frac{\text{maximum output power}}{(\text{open voltage}) \times (\text{short circuited current})}$$

than that of a prior single layer type solar battery. It should be noted that the electric field in a conversion cell of an amorphous silicon solar battery affects much to an output current. The electric field in the structure of FIG. 2 is higher than that of a prior art, since the thickness of each conversion cell of the present solar battery for a predetermined light intensity is thinner than that of a prior solar battery.

Further, since a prior single layer type solar battery must have an insulation layer 52 for insulating each of the conversion cells, an insulation layer made of high molecular compound film or non organic thin film deteriorates the characteristics of the solar battery by adding an impurity into an amorphous silicon layer, and/or deterioration of surface profile of a stainless steel substrate. On the other hand, the present solar battery has no such insulation layer, but amorphous silicon layers are deposited directly on the substrate.

Although the above analysis is directed to the relationship between the power supply of a solar battery and the power consumption by an IC 26, it should be appreciated that the power consumption in the IC 26 in the above analysis includes the power consumption in the display unit 23 and other components.

Figure 4:
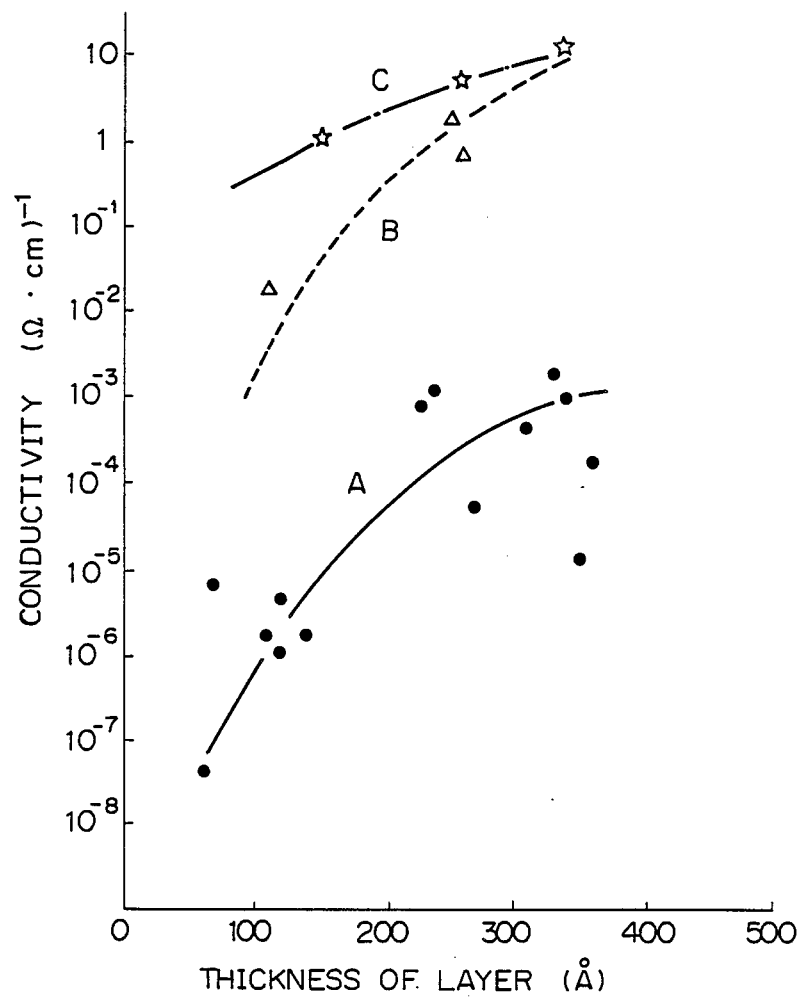
FIG. 4 shows the curves of the relations between film thickness and conductivity of N-type amorphous silicon layer.

The further improvement of the solar battery is described in accordance with FIGS. 3 and 4.

FIG. 3 shows an enlarged view of the cross section of FIG. 2. The first coversion cell 31-1 has a P-layer ($P_1$), an I-layer ($I_1$, intrinsic layer), and an N-layer ($N_1$). The second cell 31-2 has similarly the layers $N_2$, $I_2$ and $P_2$, and the third cell 31-3 has the layers $N_3$, $I_3$ and $P_3$. The thickness of the inner intrinsic layer $I_1$ is large as compared with that of the outer intrinsic layer $I_3$, so that all the three layers may generate the same current. Since the light which illuminates a solar battery is absorbed by each layer, the light intensity in the inner layer (31-1) is weak as compared with that of an outer layer (31-3), and therefore, the inner layer must be thicker than that of the outer layer in order to assure the same current by each cells. It should be appreciated that all the cells must have the same capacity, or must provide the same current, since the cells are connected in series, and the capacity of the solar battery itself is restricted by the weakest cell.

As for a P-layer and an N-layer, it is preferable that those layers are as thin as possible, since only light absorbed in an I-layer is effective for opto-electric conversion, but light absorbed in an N-layer and P-layer is useless. In particular, an N-layer must be thin. The thickness of a P-layer is not so important as that of an N-layer, since the band gap of a P-layer is large, and does not absorb visible light.

Further, the contact between a P-layer and an N-layer must provide an ohmic contact, instead of a P-N contact.

However, when the thickness of an N-layer is thin, the electric resistance increases, or the conductivity decreases as shown in FIG. 4, in which the horizontal axis shows thickness of a layer in Å, and the vertical axis shows the electric conductivity. The curve A in FIG. 4 shows the characteristics of a prior amorphous silicon layer, the curves B and C show the characteristics of micro-crystal silicon. When the resistance is high, the ohmic contact is not obtained between P-N contacts (between $N_1$ and $P_2$, and $N_2$ and $P_3$)

The curve B solves the above problem partially, by using a micro-crystal layer, instead of an amorphous layer, but it is not enough.

The curve C shows the characteristics of the present invention. An N-layer according to the present invention of the curve C is obtained by the specific gas ratio and discharge power density in plasma CVD process for deposition of an N-layer. That is to say, according to the present invention, a micro-crystal layer is obtained by using the gas ratio $PH_3/SiH_4=0.1–1.0\%$, preferably, 0.2–0.5%, and $H_2/SiH_4=50–200$, preferably, 80–100, and the discharge power density of 0.2–2.0, preferably, 0.5–1.0 Watt/cm$^2$. The diameter of micro-crystal grain in above conditions is less than the thickness of a layer, and the electric conductivity is high enough as shown in the curve C in FIG. 4.

The thickness of an N-layer according to the present invention is in the range between 80 Å and 110 Å, and the use of that thickess increases the output current of a solar battery by about 10% as compared with that of a solar battery which has an N-layer of the thickness 250 Å of the characteristics B in FIG. 4.

In a preferred numerical embodiment, an N-layer is made of hydrogenated micro-crystal silicon ($\mu$c-Si:H)

with the thickness 80–110 Å, a P-layer is made of hydrogenated silicon carbide (a–Si:C:H) or amorphous hydrogenated silicon nitride (a–Si:N:H) of the thickness 50–100 Å, and an I-layer is made of amorphous hydrogenated silicon (a-Si:H) of the thickness 420–4000 Å. The thickness of an I-layer depends upon the location of a cell as mentioned before.

Further preferably, the thickness of said N-layer is in the range between 80 Å and 100 Å.

Figure 6:
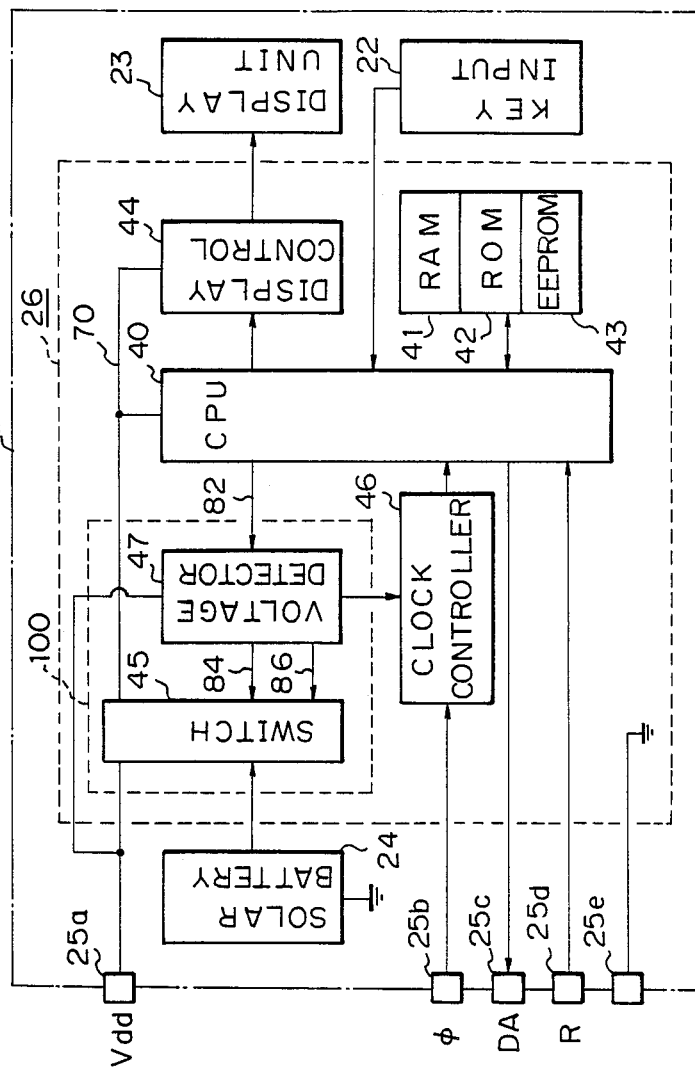
FIG. 6 is a circuit diagram of an IC card of FIG. 1 according to the present invention.

FIG. 6 shows a circuit diagram of the IC card of FIG. 1.

In FIG. 6, the external connection terminal 25 has a contact 25a for input of power supply $V_{dd}$, a clock contact 25b for input of clock signal $\phi$, a data contact 25c for input and output of data DA, a reset contact 25d for input of a reset signal R, and a ground contact 25e for grounding the IC card.

The IC 26 embedded in the card 21 has a CPU 40 for data processing (calculation), a RAM 41 (random access memory) for storing data for operating said CPU 40, a ROM 42 (read only memory) for storing program for said CPU 40 and data, an EEPROM 43 (electrically erasable programmable read only memory) for storing secret data like a secret code, a display drive circuit 44, a switch 45 for switching between an internal power supply and an external power supply, a clock controller 46 which functions to receive an external clock signal $\phi$ in ON-line state, and to generate the clock signal $\phi$ in OFF-line state, and a voltage detector 47 which detects the operational state of the IC card whether it is in ON-line state or in OFF-line state, and switches the switch 45 and the clock controller 46 according to the operational state. The CPU 40 is coupled with the key input 22, the contacts 25a, 25c, 25d, the RAM 41, the ROM 42, the EEPROM 43, and display control circuit 44, the switch 45, the clock controller 46, and the voltage detector 47. The display control circuit 44 is coupled with the display unit 23. The switch 45 is coupled with the solar battery 24. And, the clock controller 46 is coupled with the contact 25b.

A voltage control circuit for controlling the operational voltage from the solar battery constant, and a voltage booster for raising the voltage for operation of the EEPROM 43 are also provided, although they are not shown in FIG. 4.

The operation of the IC card of FIG. 6 is as follows.

An OFF-line operation in which the IC card is not coupled with an external device is first explained.

In OFF-line state, the voltage detector 47 detects the fact that an external power supply voltage is not supplied to the contact 25b, the switch 45 and the clock controller 46 are switched to the OFF-line state. Then, the output of the solar battery 24 is coupled with the CPU 40 and the display control circuit 44 through the switch 45 so that the power supply in the solar battery generated in the conversion cells 31-1 through 31-3 upon illumination of the solar battery is supplied to the CPU 40 and the display control circuit 44. The clock controller 46 generates the clock signal $\phi$, which is supplied to the CPU 40.

The identification whether the user of the card is the true owner of the card is tested as follows. A card user who keeps the card inputs the secret code of the card owner to the CPU 40 by operating the key input portion 22. Then, the CPU 40 which operates in accordance with the program stored in the ROM 42 compares the secred code stored in the EEPROM 43 with the secret code from the key input portion 22, and when they coincides with each other, the fact of the coincidence is displayed on the display unit 23 through the display control circuit 44. Then, the CPU 40 displays the balance of the account, and operates the IC card.

On the other hand, when the secret code from the key input portion does not coincide with the secret code stored in the EEPROM, the CPU 40 displays the fact of incoincidence on the display unit 23 through the display control circuit 44, and urges the card user to try again. Further, the CPU stores the number of trials of incoincidence in the particular area of the EEPROM 43. When the number of trials of incoincidence reaches a predetermined number, for instance three or five, the CPU determines that the card user is not the card owner and displays the decision by the CPU on the display unit 23, and locks the IC 26 by prohibiting reading and writing data in the memories including the RAM and the ROM. Thus, the wrong or dishonest use of the card is prevented.

The ON-line operation in which the IC card is coupled with an external device is next explained.

The voltage detector 47, upon detecting that the external power supply voltage supplies to the contact 25b, the switch 45 and the clock controller 46 are switched to the ON-line state. Then, the output of the solar battery 24 is switched off by the switch 45, and the external power supply voltage $V_{dd}$ is supplied to the IC 26 through the contact 25a. Simultaneously, the external clock signal $\phi$ is applied to the CPU 40 through the contact 25b and the clock controller 46. The data DA is sent and received between the CPU 40 and an external device through the contact 25c.

Figure 7:
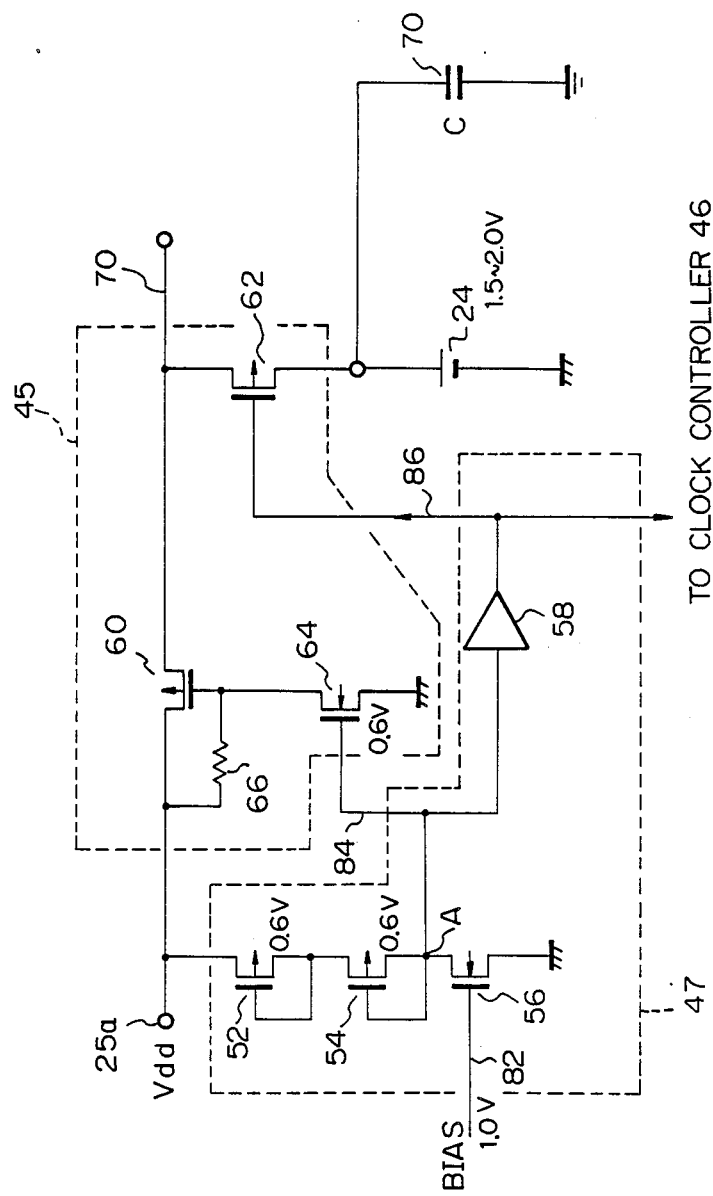
FIG. 7 is a circuit diagram of the switch 45 and the voltage detector 47 in FIG. 6.
Figure 11:
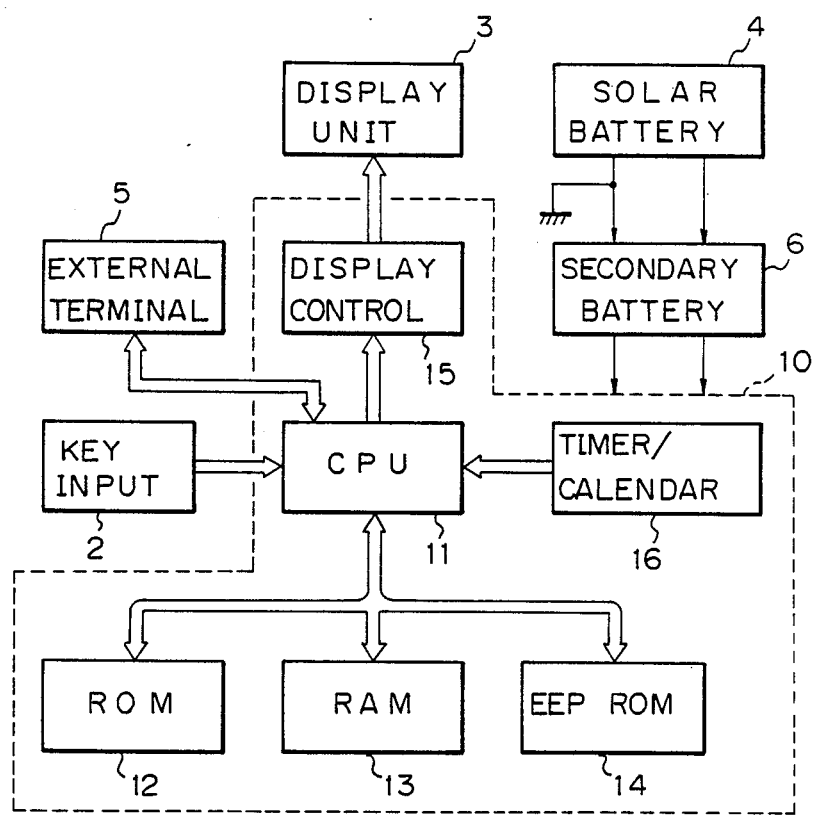
FIG. 11 is a circuit diagram of a prior IC card of FIG. 10.

FIG. 7 shows a detailed circuit diagram of the portion of the switch 45 and the voltage detector 47 in FIG. 6. In the figure, the external contact 25a is one of the external contacts 25a through 25e in FIG. 6. When the IC card is connected to an external device, the power voltage of 5 volts is applied to the power supply contact ($V_{dd}$) 25a by the external device. The first switch 60 is inserted between the power supply contact 25a and the power supply line 70 for an IC circuit. The resistor 66 is connected bewteen the source electrode and the gate electrode of the switch 60, which is implemented by a P-channel MOSFET. The second switch 62 is connected between the power supply line 70 and the solar battery 24. That switch 62 is also implemented by a P-channel MOSFET.

The voltage detector 47 has three series connected field effect transistors (FET) 52, 54, and 56 between the power supply contact 25a and the ground. The FET's 52 and 54 provides a predetermined voltage drop of 0.6 volt, and the FET 56 is fed a bias voltage of 1.0 volt to the gate electrode. The output point A of the voltage detector is the junction between the FET 54 and the FET 56, and the potential of the output point A is lower by 1.2 volt than the power supply voltage at the contact 25a. The output point A of the voltage detector 47 is connected to the first switch 60 through the FET 64, and the second switch 62 through the inverter 58.

In a preferable embodiment of the invention, the voltage detector 47 has the threshold voltage of 3.2 volt. When the external voltage at the contact 25a is higher than 3.2 volt, the FET 64 is conductive, and so, the first switch 60 is conductive, that is to say, said first switch 60 is conductive, and the power voltage to the IC circuit is supplied by the external device. The output of the inverter 58 at that time is at its higher level, and so, the second switch 62 is non-conductive. So, the solar battery 24 is switched OFF.

When the external voltage at the contact 25a is lower than 3.2 volt, the FET 64 is non-conductive, and the first switch 60 is non-conductive. The output of the inverter 58 is at its low level, and the second switch 62 is conductive. Therefore, the solar battery which has 1.5–2.0 volt supplies the power to the IC circuit, and the external power supply is switched off.

It should be appreciated that the solar battery 24 is protected from abnormal high voltage, or static electricity, on the contact 25a, by the switch 45, because the first switch 60 is non-conductive when the IC card is in OFF-line state in which the IC card is not connected to an external device, and the second switch 62 is non-conductive when the IC card is in ON-state in which the IC card is connected to an external device.

The switch 45 and the voltage detector 47 may have enough withstand voltage for static electricity, since those members are integrated on the same semiconductor chip as that of the CPU 40, the memories 41, 42 and 43, et al, and therefore, it is easy to assure the withstand voltage up to 500–600 volts in a conventional semiconductor producing process.

The capacitor 70 is coupled across the solar battery 24 so that that capacitor 70 is charged. When the IC circuit needs much power in updating the EEPROM, the power is supplied by both the solar battery 24 and the capacitor 70.

Next, the size of each component on an IC card is discussed.

The size of each component must be designed so that the IC card can be used conveniently.

FIG. 8 shows the example of a finger print on a relisient plastics seat with the width 0.5 mm so that the size of each key of the key input portion 22 is determined. From FIG. 8, the preferable size of a key is for instance $9 \times 6.5$ mm$^2$.

The visibility of a character on a display unit 23 depends upon the size of a character, the printing technique, quality of paper, and/or quality of ink. As for the size of characters, the present embodiment takes the size of $2 \times 3.05$ mm$^2$ a shown in FIG. 9(a). The size of 8 point characters which are used in Japanese newspapers, having $2.811 \times 2.81$ m$^2$, is shown in FIG. 9(b) for comparison.

The embodiment of the size of a key input portion 22, a display unit 23 and a solar battery 24, and the ratio of those members to the area of an IC card is shown in the following table, together with the data of a prior art of FIG. 10.

| item | Present invention area | ratio | Prior art (FIG. 10) area | ratio |
| --- | --- | --- | --- | --- |
| IC card | 4644 mm$^2$ | 100% | 4644 mm$^2$ | 100% |
| key input | 1404 mm$^2$ | 30% | 1416 mm$^2$ | 30% |
| display unit | 242 mm$^2$ | 5% | 368 mm$^2$ | 8% |
| others | 2074 mm$^2$ | 45% | 2494 mm$^2$ | 54% |
| solar battery | 924 mm$^2$ | 20% | 366 mm$^2$ | 8% |

The advantage of the present invention are enumerated as follows.

(1) No secondary battery is necessary, and an IC card operates with only a solar battery. Therefore, the circuit structure of the IC card is simplified.

(2) The update operation of an EEPROM 43 in OFF-line state is possible, and therefore, the security of an IC card is improved. Further, the card may be used either in OFF-line state or in ON-line state.

(3) Since the ratio of a solar battery is approximately 20% of the whole area when a standardized international card is used, other components, like a key input portion, and a display unit can occupy the wide area. Therefore, the operability of a card is improved. Further, the thickness of the IC card is thin, for instance, it is merely 0.76 mm.

(4) Since the structure of a solar battery is simple, the producing cost of the IC card itself is reduced.

(5) The conversion efficiency of a solar battery is raised by 2–3 times as compared with a prior single layer solar battery. The improved solar battery is also used to display contents of a memory in OFF-line state. Therefore, the application fields of an IC card are considerably increased.

Some modifications are possible of course to those skilled in the art. For instance, the layout of each of the components is not restricted to that of FIG. 1, and the circuit of the IC 26 is not restricted to that of FIG. 6. Further, if an IC card is used only in OFF-line state, the external terminal 25 may be omitted.

From the foregoing, it will now be apparent that a new and improved IC card has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. An IC card with a solar battery comprising; a card body, a key input portion for data input mounted on a first surface of said card body, a display unit for data display mounted on said first surface of said card body, a solar battery for supplying operational power for said IC card mounted on said first surface of the card body, and an integrated circuit having at least a CPU, a ROM for storing program for operating said CPU, a RAM for storing operational data of said CPU, and an EEPROM for storing electrically erasable read only data, wherein the improvements comprise in that;
    said solar battery is a tandem type solar battery having a substrate, a plurality of laminated opto-electric conversion cells made of amorphous silicon deposited on said substrate, and a transparent electrode deposited on said conversion cells,
    each conversion cell is comprised of P-layer, I-layer and N-layer, and said N-layer is made of micro-crystal silicon, and said P-layer and said I-layer are made of amorphous silicon and thickness of said N-layer is in the range between 80 Å and 110 Å.

2. An IC card with a solar battery according to claim 1, wherein ratio of area of said key input portion to whole area of said first surface of the card body is approximate 30%, ratio of area of said solar battery to whole area of the card body is in the range between 10% and 30%, and size of said card body is approximately $86 \times 54$ mm.

3. An IC card with a solar battery according to claim 2, wherein ratio of area of said solar battery to whole area of said card body is approximately 20%.

4. An IC card with a solar battery according to claim 1, further comprising an external terminal for coupling the IC card with an external device for input and output of data and reception of external power supply, a switch (45) for switching power supply for the IC card between an external power supply and a solar battery mounted in the IC card, and a voltage detector (47) for controlling said switch so that an external power supply is used when voltage of external power supply is higher than a predetermined voltage, and a solar battery is used when external power supply voltage is lower than said predetermined voltage.

5. An IC card with a solar battery according to claim 4, wherein a capacitor is coupled across said solar battery.

6. An IC card with a solar battery according to claim 1, wherein number of conversion cells is one selected from three and four.

7. An IC card with a solar battery according to claim 1, wherein thickness of said N-layer is in the range between 80 Å and 100 Å.

* * * * *